(12) United States Patent
Iwamoto (10) Patent No.: US 10,580,962 B2
(45) Date of Patent: Mar. 3, 2020

(54) METHOD FOR MANUFACTURING PIEZOELECTRIC DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 381 days.

(21) Appl. No.: 15/379,532

(22) Filed: Dec. 15, 2016

(65) Prior Publication Data

US 2017/0098758 A1 Apr. 6, 2017

Related U.S. Application Data

(60) Division of application No. 14/183,874, filed on Feb. 19, 2014, now Pat. No. 9,570,668, which is a continuation of application No. PCT/JP2012/071257, filed on Aug. 23, 2012.

(30) Foreign Application Priority Data

Aug. 26, 2011 (JP) .................................. 2011-184625

(51) Int. Cl.
| | | |
|---|---|---|
| *H01L 41/312* | (2013.01) | |
| *H01L 41/29* | (2013.01) | |
| *H03H 9/02* | (2006.01) | |
| *H03H 3/02* | (2006.01) | |
| *H03H 3/08* | (2006.01) | |
| *H01L 41/313* | (2013.01) | |

(Continued)

(52) U.S. Cl.
CPC ........ *H01L 41/312* (2013.01); *H01L 41/0815* (2013.01); *H01L 41/27* (2013.01); *H01L 41/29* (2013.01); *H01L 41/313* (2013.01); *H03H 3/02* (2013.01); *H03H 3/08* (2013.01); *H03H 9/02574* (2013.01); *Y10T 29/42* (2015.01)

(58) Field of Classification Search
CPC ..... H01L 41/0815; H01L 41/27; H01L 41/29; H01L 41/312; H01L 41/313; H03H 3/02; H03H 3/08; H03H 9/02574; Y10T 29/42
See application file for complete search history.

(56) References Cited

U.S. PATENT DOCUMENTS

| | | | | |
|---|---|---|---|---|
| 6,629,341 | B2 * | 10/2003 | Wilkie | .................... H01L 41/29 29/25.35 |
| 2009/0189482 | A1 * | 7/2009 | Shibata | ................. H01L 41/319 310/311 |

FOREIGN PATENT DOCUMENTS

JP 2006109129 A * 4/2006

OTHER PUBLICATIONS

Iwamoto, "Piezoelectric Device and Method for Manufacturing Piezoelectric Device", U.S. Appl. No. 14/183,874, filed Feb. 19, 2014.

* cited by examiner

*Primary Examiner* — A. Dexter Tugbang
(74) *Attorney, Agent, or Firm* — Keating & Bennett, LLP (57) ABSTRACT

In a method for manufacturing a piezoelectric device while stably achieving strong bonding, a moisture-absorbing layer is formed on a bonding surface side of a piezoelectric single-crystal substrate. The moisture-absorbing layer is allowed to absorb moisture. A binder layer is formed on a bonding surface side of a supporting substrate. The moisture-absorbing layer is placed on the binder layer. A silica precursor in the binder layer is converted into silica through a hydrolysis reaction with moisture in the moisture-absorbing layer.

8 Claims, 9 Drawing Sheets

(51) Int. Cl.
*H01L 41/08* (2006.01)
*H01L 41/27* (2013.01)

METHOD FOR MANUFACTURING PIEZOELECTRIC DEVICE

BACKGROUND OF THE INVENTION

1. Field of the Invention

The present invention relates to a piezoelectric device that includes a piezoelectric substance thin film bonded to a supporting substrate and a method for manufacturing the piezoelectric device.

2. Description of the Related Art

In recent years, many piezoelectric devices that include a piezoelectric substance thin film have been developed (see, for example, Japanese Unexamined Patent Application Publication No. 6-326553). In general, in piezoelectric devices that include a piezoelectric substance thin film, the piezoelectric substance thin film is bonded to a supporting substrate. Various methods for bonding a piezoelectric substance thin film to a supporting substrate have been proposed and used. For example, in a bonding method referred to as hydrophilic bonding (see Japanese Unexamined Patent Application Publication No. 6-326553), an inorganic oxide layer is formed on both the bonding surface of a mirror-finished piezoelectric thin film and the bonding surface of a supporting substrate. Hydroxy groups are then formed on the surface of the inorganic oxide layer. The surface of the inorganic oxide layer on the piezoelectric thin film side is then brought into contact with and is bonded to the surface of the inorganic oxide layer on the supporting substrate side through hydrogen bonding between the hydroxy groups. The bonding strength between the inorganic oxide layer on the piezoelectric thin film side and the inorganic oxide layer on the supporting substrate side is significantly improved by heat treatment at 200° C. or more for eliminating $H_2O$ from the hydrogen-bonded hydroxy groups.

In a bonding method referred to as activated bonding, the bonding surface on a mirror-finished piezoelectric thin film side and the bonding surface on a supporting substrate side are sputter-etched in an inert gas atmosphere or in a vacuum to remove contaminants from the surface and activate the surface. The bonding surface on the piezoelectric thin film side is then brought into contact with and is firmly bonded to the bonding surface on the supporting substrate side through an amorphous layer.

In a bonding method using a resin adhesive layer, the adhesive layer is formed on the bonding surface on the piezoelectric thin film side or on the supporting substrate side, and the bonding surface on the piezoelectric thin film side and the bonding surface on the supporting substrate side are then joined together and hardened to firmly bond the bonding surface on the piezoelectric thin film side to the bonding surface on the supporting substrate side.

In a bonding method that involves heat treatment at a relatively high temperature, such as 200° C. or more, as in hydrophilic bonding, a large difference in coefficient of linear expansion between the piezoelectric thin film and the supporting substrate results in a failure, such as separation of the piezoelectric thin film from the supporting substrate, due to thermal stress resulting from the heat treatment, and therefore it is impossible to stably achieve strong bonding.

On the other hand, unlike hydrophilic bonding, activated bonding can achieve strong bonding without high-temperature heat treatment. Thus, activated bonding is not substantially limited by the difference in coefficients of linear expansion between the piezoelectric substance and the supporting substrate.

However, activated bonding has a low resistance to surface contamination and requires strict management of the bonding environment. Thus, it is difficult to stably achieve strong bonding. Furthermore, it is impossible to achieve sufficient bonding strength with a certain combination of materials, for example, a LN substrate and a substrate having a silicon nitride film on the surface thereof.

In a bonding method using a resin adhesive, since the application of heat softens the adhesive, a difference in coefficients of linear expansion between the supporting substrate and the piezoelectric thin film may cause a misalignment between the supporting substrate and the piezoelectric thin film after heating, causing the surface to become undulated.

SUMMARY OF THE INVENTION

Accordingly, preferred embodiments of the present invention provide a piezoelectric device that stably achieves strong bonding in a non-heating environment without characteristic degradation, and a method for manufacturing the piezoelectric device.

A piezoelectric device according to a preferred embodiment of the present invention includes a piezoelectric thin film, a supporting substrate, a silicon oxide layer, and a moisture-absorbing layer. The piezoelectric thin film is formed of a piezoelectric substance. The piezoelectric thin film is disposed on top of a main surface of the supporting substrate. The silicon oxide layer is formed of silicon oxide and is disposed between the piezoelectric thin film and the supporting substrate. The moisture-absorbing layer is more hygroscopic than the piezoelectric thin film and the supporting substrate, is in contact with substantially the entire surface of the silicon oxide layer, and is disposed between the piezoelectric thin film and the supporting substrate.

A method for manufacturing a piezoelectric device according to another preferred embodiment of the present invention includes a moisture-absorbing layer forming step, a moisture-absorbing step, a binder layer forming step, a bonding step, and a binder layer solidifying step. The moisture-absorbing layer forming step is a step of forming a moisture-absorbing layer on a bonding surface side of at least one of a piezoelectric substrate and a supporting substrate. The moisture-absorbing step is a step of allowing the moisture-absorbing layer to absorb moisture. The binder layer forming step is a step of forming a binder layer on the bonding surface side of the piezoelectric substrate or the supporting substrate. The binder layer is formed of a material containing a silica precursor. The bonding step is a step of bonding the piezoelectric substrate to the supporting substrate with the binder layer and the moisture-absorbing layer interposed between the bonding surfaces of the piezoelectric substrate and the supporting substrate. The binder layer solidifying step is a step of hydrolyzing the silica precursor with moisture absorbed in the moisture-absorbing layer to convert the silica precursor into silica. The silica precursor can undergo a hydrolysis reaction even at a temperature of about 100° C. or less.

In this manufacturing method, moisture absorbed in the moisture-absorbing layer is supplied to the silica precursor that is active even at a low temperature in a range of about 50° C. to about 100° C., for example, and the silica precursor is converted into silica through hydrolysis. This solidifies the binder layer. The hydrolysis reaction in a non-heating environment or in a low-temperature heating environment allows the piezoelectric substrate to be stably and firmly bonded to the supporting substrate without cracking in the piezoelectric substrate or the supporting substrate. Thus, the materials of the piezoelectric substrate and the supporting substrate can be selected so as to optimize the characteristics and reliability of the device without restriction of the difference in coefficient of linear expansion between the piezoelectric substrate and the supporting substrate. Since the silicon oxide layer formed through the bonding has high hardness and a low electric conductivity, the silicon oxide layer is unlikely to cause deterioration in device characteristics. Furthermore, the moisture-absorbing layer extending over the entire or substantially the entire surface of the bonding surface allows moisture to be supplied to the entire surface of the bonding surface and thus minimizes variations and local reduction in bonding strength.

Such production method of silica from a silica precursor is generally referred to as a sol-gel method. Silica precursors used in the sol-gel method are soluble in solvents and can be converted into silica through a hydrolysis reaction or a polymerization reaction. Such silica precursors are generally distributed as spin on glass (SOG) materials, for example. However, silanol (for example, a "—$Si(OH)_4$—" polymer), which is a most widely used SOG material, requires heating at a high temperature of approximately 400° C. for the production of silica and is therefore unsuitable for the manufacture of piezoelectric devices. Silica precursors suitable for the manufacture of piezoelectric devices include those that can undergo a hydrolysis reaction even at about 100° C. or less, such as silicate ester and polysilazane. Examples of silicate ester include $Si_4O_3(OCH_3)_{10}$. Examples of polysilazane include a "—$(SiH_2NH)$—" polymer.

In the method for manufacturing a piezoelectric device, the piezoelectric substrate is preferably formed of a piezoelectric substance single crystal. The piezoelectric substrate preferably is an LT substrate, an LN substrate, or a quartz substrate, for example.

Such a piezoelectric substrate has very low hygroscopicity, and the moisture-absorbing layer is effective for such a piezoelectric substrate.

In the method for manufacturing a piezoelectric device, the moisture-absorbing layer is preferably a porous film, an aluminum nitride film, or a silicon oxide layer. The silicon oxide layer is preferably formed by sputtering in a low degree of vacuum or low-temperature CVD.

These moisture-absorbing layers are sufficiently more hygroscopic than the piezoelectric substrate and the supporting substrate. These moisture-absorbing layers disposed on the piezoelectric substrate do not adversely affect the characteristics or reliability of the device.

In the method for manufacturing a piezoelectric device, the bonding step and the binder layer solidifying step are preferably performed in a reduced pressure atmosphere.

This promotes vaporization of a solvent component in the binder layer and thus prevents or reduces the occurrence of voids in the bonding surface.

The method for manufacturing a piezoelectric device preferably further includes an ion implantation step and a separation step. The ion implantation step is a step of implanting ions into the piezoelectric substrate through the bonding surface. The separation step is a step of separating a region on the bonding surface side of the piezoelectric substrate as a piezoelectric thin film from a defective layer of the piezoelectric substrate through ion implantation by heating.

The method for manufacturing a piezoelectric device preferably further includes an ion implantation step, a temporary supporting step, a separation step, and a supporting step. The temporary supporting step is a step of forming a temporary supporting substrate on the ion-implanted surface side of the piezoelectric substrate. The temporary supporting substrate is made of the same material as the piezoelectric substrate or producing a thermal stress at the interface between the temporary supporting substrate and the piezoelectric substrate smaller than the thermal stress at the interface between the supporting substrate and the piezoelectric substrate. The supporting step is a step of forming the supporting substrate on the piezoelectric thin film separated from the piezoelectric substrate.

These manufacturing methods form a piezoelectric thin film having a uniform thickness and a desired crystal orientation and improve the material use efficiency of the piezoelectric substance. These manufacturing methods produce an uneven ion distribution density in the thickness direction of the piezoelectric thin film. Thus, the piezoelectric thin film may be slightly warped, making it difficult to bond the piezoelectric thin film to the supporting substrate. In accordance with these manufacturing methods, however, the piezoelectric substrate is capable of being bonded to the supporting substrate in a low-temperature environment while reducing the influence of thermal stress. Thus, these manufacturing methods are very useful.

The method for manufacturing a piezoelectric device preferably further includes a functional electrode forming step of forming a functional electrode on the piezoelectric thin film.

These manufacturing methods utilize the conversion of a silica precursor into silica through a hydrolysis reaction to firmly bond the piezoelectric thin film to the supporting substrate and significantly reduce or prevent signal leakage from a functional electrode in piezoelectric devices.

Various preferred embodiments of the present invention use a binder layer containing a silica precursor that is capable of being converted into silica at a low temperature in order to bond the piezoelectric substrate to the supporting substrate. The conversion of the silica precursor into silica solidifies the binder layer at a low temperature and thereby firmly and stably bonds the piezoelectric substrate to the supporting substrate. The binder layer having high hardness and a low electric conductivity disposed between the bonding surfaces of the piezoelectric substrate and the supporting substrate prevents deterioration in the characteristics and reliability of the piezoelectric device. The moisture-absorbing layer that supplies moisture to the silica precursor makes the bonding strength of the binder layer uniform and stable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

First, a surface acoustic wave (SAW) device will be described below as a specific example of a piezoelectric device according to a first preferred embodiment of the present invention.

Figure 1:
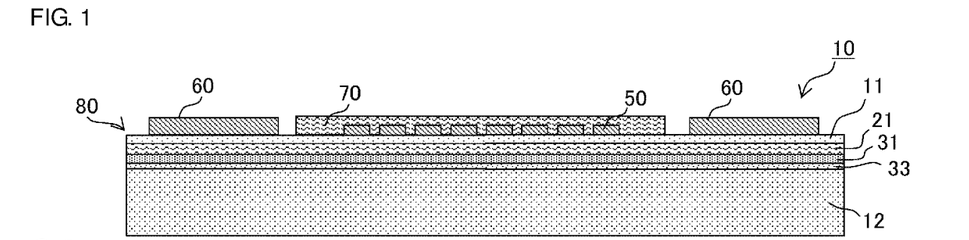
FIG. 1 is an explanatory view of the structure of an elastic wave device according to a first preferred embodiment of the present invention.

FIG. 1 illustrates the structure of a SAW device 10 according to the present preferred embodiment.

The SAW device 10 includes a multilayer substrate portion 80, an interdigital transducer (IDT) electrode 50, an electric wire 60, and a protective insulating film 70. The multilayer substrate portion 80 preferably has a total thickness of approximately 250 μm and includes a piezoelectric substance single-crystal thin film 11, a supporting substrate 12, a moisture-absorbing layer 31, a silicon oxide layer 33, and a dielectric layer 21, for example.

The supporting substrate 12 is disposed at the bottom of the multilayer substrate portion 80. The supporting substrate is an alumina substrate or a magnesia substrate. Alumina substrates and magnesia substrates have high heat conductivity and a lower coefficient of linear expansion than piezoelectric single-crystal materials. The SAW device 10 including the supporting substrate 12 has improved frequency-temperature characteristics, heat dissipation characteristics, and electric power handling capability.

The silicon oxide layer 33 is disposed on the top surface of the supporting substrate 12. As described in detail below, the silicon oxide layer 33 is configured to bond the supporting substrate 12 to the piezoelectric substance single-crystal thin film 11. The silicon oxide layer 33 is formed of silicon oxide.

The moisture-absorbing layer 31 is disposed on the top surface of the silicon oxide layer 33. The moisture-absorbing layer 31 preferably is an aluminum nitride (AlN) film having a thickness of about 1400 nm, for example. As described in detail below, the moisture-absorbing layer 31 is configured to supply moisture to a binder layer 32 (not shown). The moisture-absorbing layer 31 may be formed of another material that is more hygroscopic than a piezoelectric single-crystal substrate 1 and the supporting substrate 12. For example, the moisture-absorbing layer 31 may be an alumina, yttria, or silica layer formed by thermal spraying, a silicon oxide layer formed by sputtering or CVD at a low temperature of about 200° C. or less in a low degree of vacuum in the range of about 0.1 Pa to about 10 Pa, or a layer having a porous microstructure, such as a layer containing a resin and a volatile component in combination.

When the moisture-absorbing layer 31 has an excessively low Young's modulus, the moisture-absorbing layer 31 may be broken due to film stress applied by the piezoelectric single-crystal substrate 1 (not shown) or the piezoelectric substance single-crystal thin film 11. On the other hand, when the moisture-absorbing layer 31 has an excessively high Young's modulus, the moisture-absorbing layer 31 may be broken due to the influence of the difference in coefficient of linear expansion between the piezoelectric single-crystal substrate 1 (not shown) or the piezoelectric substance single-crystal thin film 11 and the supporting substrate 12. The moisture-absorbing layer 31 having an excessively high dielectric constant adversely affects device characteristics. Particularly in the case of a high-frequency device, characteristic degradation of the device is significant because of increased capacitance between electric wires. When the moisture-absorbing layer 31 has a large difference in coefficient of linear expansion from the piezoelectric substance material, this results in low reliability. Thus, the material of the moisture-absorbing layer 31 may be selected in consideration of Young's modulus, dielectric constant, and the coefficient of linear expansion.

The dielectric layer 21 is disposed on the top surface of the moisture-absorbing layer 31. The dielectric layer 21 preferably is a silicon oxide layer having a thickness of about 700 nm, for example. The dielectric layer 21 is configured to confine surface acoustic waves from the SAW device 10 to the surface layer and have a function of providing satisfactory characteristics. The dielectric layer 21 is not essential and may be omitted.

The piezoelectric substance single-crystal thin film 11 is disposed on the top surface of the dielectric layer 21. The piezoelectric substance single-crystal thin film 11 is a lithium tantalate (LT) single-crystal thin film. The material of the piezoelectric substance single-crystal thin film 11 may be appropriately selected from piezoelectric substances, such as LT, LN (LiNbO$_3$), LBO (Li$_2$B$_4$O$_7$), langasite (La$_3$Ga$_5$SiO$_{14}$), and KN (KNbO$_3$), for example.

The IDT electrode 50 and the electric wire 60 are patterned on the top surface of the piezoelectric substance single-crystal thin film 11. The IDT electrode 50 is electromechanically coupled to the piezoelectric substance single-crystal thin film 11. The IDT electrode 50 and the piezoelectric substance single-crystal thin film 11 constitute a surface acoustic wave resonator. The electric wire 60 transmits high-frequency signals between the IDT electrode 50 and an external circuit. The IDT electrode 50 and the electric wire 60 are aluminum-titanium multilayer films.

Figure 2:
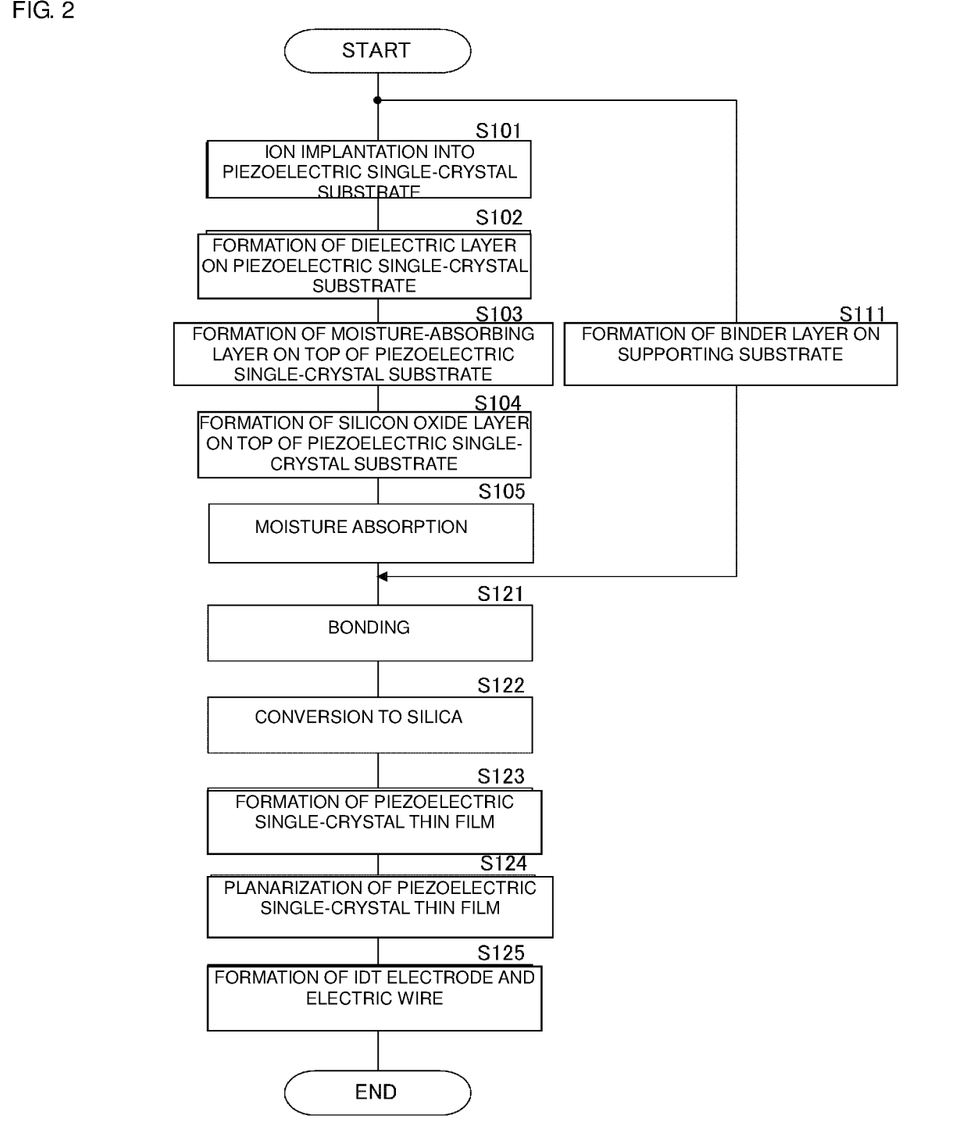
FIG. 2 is an explanatory view of the manufacturing flow of a method for manufacturing the elastic wave device according to the first preferred embodiment of the present invention.
Figure 3:
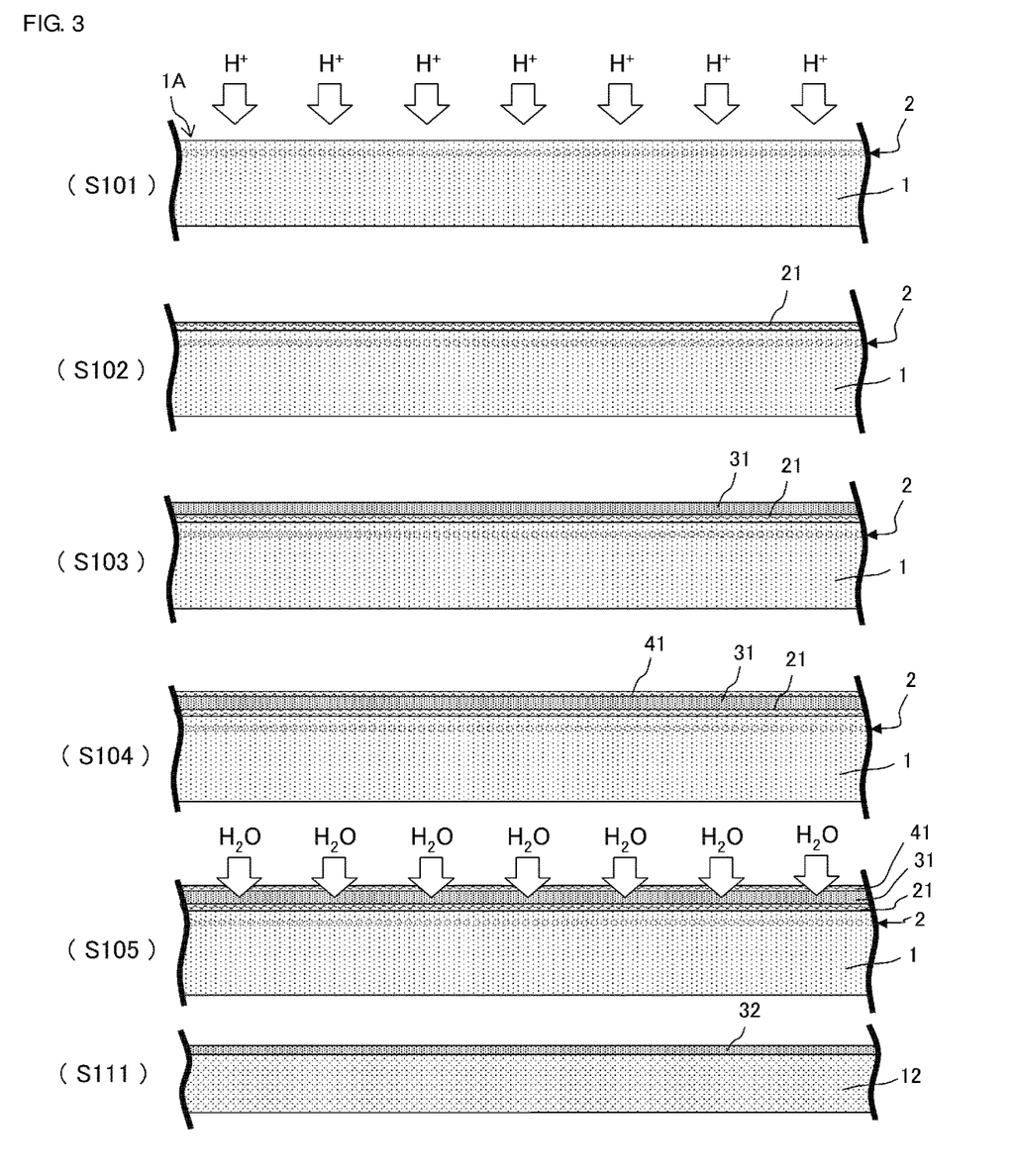
FIG. 3 is a schematic view of each step of the manufacturing flow illustrated in FIG. 2.
Figure 4:
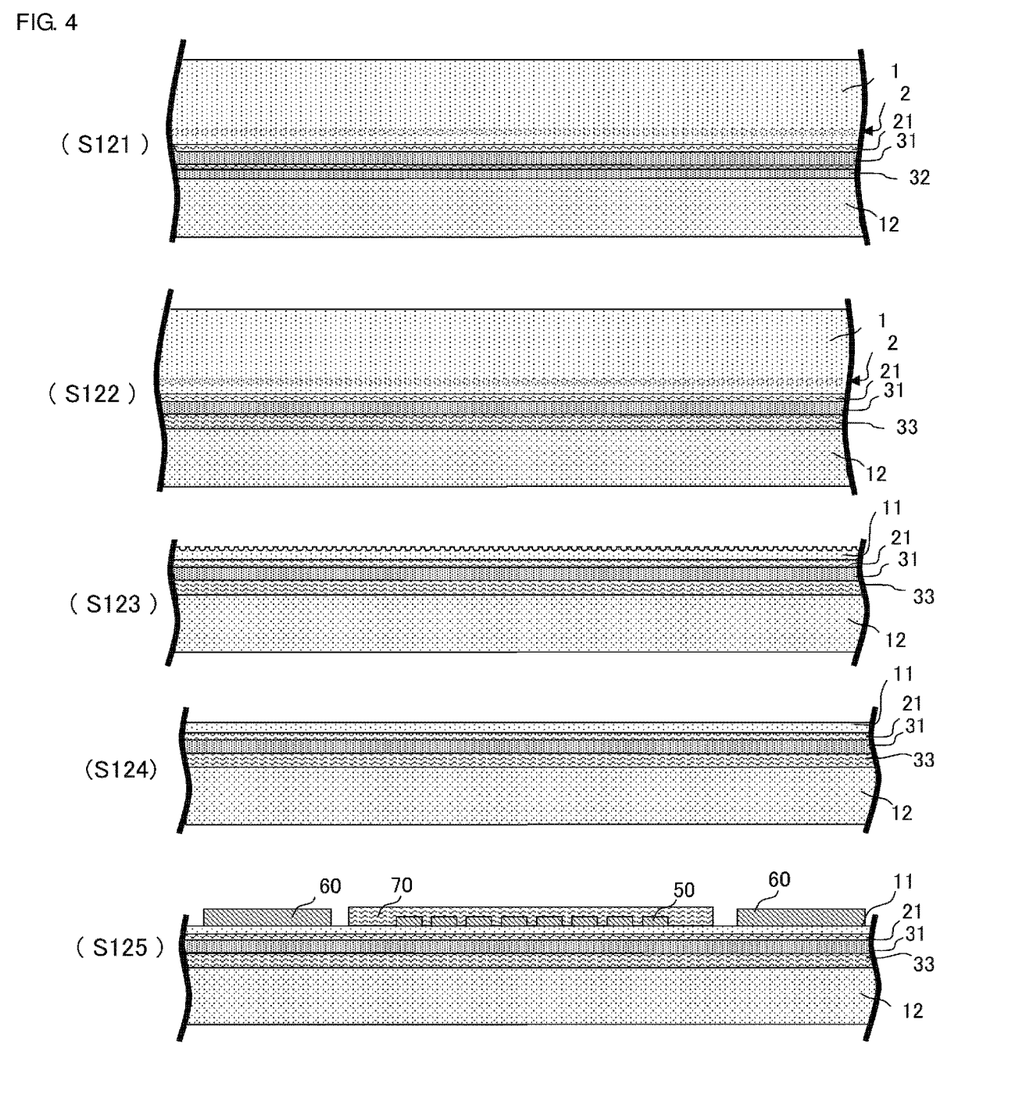
FIG. 4 is a schematic view of each step of the manufacturing flow illustrated in FIG. 2.

FIG. 2 is an explanatory view of the manufacturing flow of a SAW device according to the present preferred embodiment. FIGS. 3 and 4 are schematic views of the steps of the manufacturing flow.

First, the piezoelectric single-crystal substrate 1 is prepared. In order to separate the piezoelectric substance single-crystal thin film 11 (the reference numeral is not shown), ions are implanted into a main surface 1A (bonding surface 1A) of the piezoelectric single-crystal substrate 1 (S101). This step corresponds to the ion implantation step according to the present preferred embodiment. As illustrated in FIG. 3 (S101), this forms a defective layer 2 at a predetermined depth from the bonding surface 1A of the piezoelectric single-crystal substrate 1. The defective layer 2 is a region containing localized atoms of ions implanted in the piezoelectric single-crystal substrate 1.

More specifically, these ions are hydrogen ions. Preferably, a volume of about $1.0 \times 10^{17}$ atoms/cm$^2$ of hydrogen ions is implanted into the piezoelectric single-crystal substrate 1 at an accelerating voltage of about 80 keV, for example. This forms the defective layer 2 at a depth of approximately 550 nm from the bonding surface 1A, for example. The position of the defective layer 2 depends on the accelerating voltage of ion implantation. For example, in order to reduce the depth of the defective layer 2 by half, the accelerating voltage may be reduced by half. The ions to be implanted may be helium ions or argon ions instead of hydrogen ions.

As illustrated in FIG. 3 (S102), the dielectric layer 21 is then formed on the bonding surface 1A of the piezoelectric single-crystal substrate 1 (S102).

As illustrated in FIG. 3 (S103), the moisture-absorbing layer 31 is then formed on the dielectric layer 21 (S103). This step corresponds to the moisture-absorbing layer forming step according to the present preferred embodiment.

As illustrated in FIG. 3 (S104), a silicon oxide layer is then formed on the moisture-absorbing layer 31, and the surface of the silicon oxide layer 41 is flattened, for example, by chemical mechanical polishing (CMP) (S104). The silicon oxide layer 41 is formed so as to provide a flat surface. The silicon oxide layer 41 having a thickness as small as approximately 1 μm or less, for example, prevents moisture supply from the moisture-absorbing layer 31 to the binder layer 32 (not shown) from being blocked.

The piezoelectric single-crystal substrate 1 on which the moisture-absorbing layer 31 is formed is then left to stand in a high-humidity bath filled with water vapor for at least a predetermined period of time (S105). As illustrated in FIG. 3 (S105), the moisture-absorbing layer 31 absorbs moisture. This step corresponds to the moisture-absorbing step according to the present preferred embodiment. This step may be performed by leaving the piezoelectric single-crystal substrate 1 on which the moisture-absorbing layer 31 is formed to stand in the air at a humidity of more than 0%, by immersing the multilayer substrate in water, or by spraying water.

As illustrated in FIG. 3 (S111), the supporting substrate 12 is prepared, and the binder layer 32 is formed on the supporting substrate 12 (S111). This step corresponds to the binder layer forming step according to the present preferred embodiment.

The binder layer 32 is formed of a SOG material that contains a silica precursor dissolved in or mixed with a solvent component. The supporting substrate 12 on which the binder layer 32 is formed is therefore preferably placed in a reduced pressure atmosphere or in a heating atmosphere of one hundred and several tens of degrees after the formation of the binder layer to promote the vaporization of the solvent component in the binder layer 32.

The silica precursor is a silicate having the composition $Si_4O_3(OCH_3)_{10}$ or a polysilazane polymer having the composition "—$(SiH_2NH)$—". These silica precursors are active even at a low temperature in the range of about 50° C. to about 100° C. and can undergo a hydrolysis reaction upon the supply of moisture. The following are hydrolysis reaction formulae of these silica precursors.

$$Si_4O_3(OCH_3)_{10} + 10H_2O \rightarrow Si_4O_3(OH)_{10} + 10CH_3OH$$

$$Si_4O_3(OH)_{10} \rightarrow 4SiO_2 + 5H_2O \qquad \text{Silicate:}$$

$$—(SiH_2NH)— + H_2O \rightarrow SiO_2 + NH_3 + 2H_2 \qquad \text{Polysilazane:}$$

The silica precursor may be one having another composition that can be converted into silica through a hydrolysis reaction or a polymerization reaction at a low temperature in the range of about 50° C. to about 100° C.

As illustrated in FIG. 4 (S121), the binder layer 32 on the supporting substrate 12 side is then bonded to the silicon oxide layer 41 (the reference numeral is not shown) on the piezoelectric single-crystal substrate 1 side (S121). This step corresponds to the bonding step according to the present preferred embodiment. This step is also preferably performed in a reduced pressure atmosphere or in a heating atmosphere of one hundred and several tens of degrees to promote the vaporization of the solvent component in the binder layer 32, thus significantly reduces or prevents the occurrence of voids in the bonding surface.

The piezoelectric single-crystal substrate 1 bonded to the supporting substrate 12 is then left to stand in a heating environment of about 80° C. for a predetermined period of time (S122). Such a heating environment promotes the conversion of the binder layer 32 into silica, and the silica precursor is converted into silica (silicon oxide) at the low temperature. This step corresponds to the binder layer solidifying step according to the present preferred embodiment. As illustrated in FIG. 4 (S122), the silicon oxide layer 33 is formed from the binder layer 32 (not shown), thus the supporting substrate 12 is firmly bonded to the piezoelectric single-crystal substrate 1. The binder layer 32 is supplied with moisture from the moisture-absorbing layer 31. The silica precursor in the binder layer 32 is converted into silica at a low temperature in a short period of time.

Particularly when the piezoelectric single-crystal material is LT or LN, pyroelectricity of the piezoelectric single-crystal material causes a problem. More specifically, heat load at a high temperature for a long time in the bonding of the piezoelectric single-crystal substrate 1 to the supporting substrate 12 may generate pyroelectric charges in the piezoelectric single-crystal substrate 1. Pyroelectric charges may destroy the functional electrode of the device or may cause deterioration in piezoelectricity due to polarization switching of the piezoelectric single crystal. However, in the case that the piezoelectric single-crystal substrate 1 is firmly bonded to the supporting substrate 12 by heating at a low temperature as in the present preferred embodiment, this reduces the number of pyroelectric charges and realize satisfactory device characteristics.

The supporting substrate 12 firmly bonded to the piezoelectric single-crystal substrate 1 through the silicon oxide layer 33 is then placed in a heating environment of approximately 250° C. (S123), for example. As illustrated in FIG. 4 (S123), the piezoelectric single-crystal substrate 1 (the reference numeral is not shown) is separated from the defective layer 2 (the reference numeral is not shown), thus leaving the piezoelectric substance single-crystal thin film 11. This step corresponds to the separation step according to the present preferred embodiment.

The piezoelectric substance single-crystal thin film 11 that has a satisfactory thickness distribution and a very small thickness is easily produced by separating the piezoelectric substance single-crystal thin film 11 by ion implantation and heat treatment. The piezoelectric single-crystal substrate 1 can have any desired crystal orientation. Thus, the piezoelectric substance single-crystal thin film 11 formed utilizing ion implantation into the piezoelectric single-crystal substrate 1 can also have any desired crystal orientation. Thus, the piezoelectricity of a SAW device is improved by producing the piezoelectric substance single-crystal thin film 11 having a crystal orientation desirable for the SAW device.

As illustrated in FIG. 4 (S124), the surface of the piezoelectric substance single-crystal thin film 11 is then flattened, for example, by CMP (S124).

As illustrated in FIG. 4 (S125), the IDT electrode 50, the electric wire 60, and the protective insulating film 70 necessary for the operation of the SAW device are then formed on the piezoelectric substance single-crystal thin film 11 (S125). This step corresponds to the functional electrode forming step according to the present preferred embodiment. SAW devices are then manufactured by dicing.

In accordance with the method for manufacturing a SAW device as described above, the bonding strength between the piezoelectric single-crystal substrate 1 and the supporting substrate 12 is increased with the conversion of the binder layer into silica at a low temperature. Thus, even with a large difference in coefficients of linear expansion between the piezoelectric single-crystal substrate 1 and the supporting substrate 12, failures in bonding rarely occur.

In particular, since the piezoelectric substance single-crystal thin film 11 preferably is formed through ion implantation in the present preferred embodiment, the crystals of the piezoelectric substance single-crystal thin film 11 contain atoms of ions, and the distribution density of the atoms of ions is localized in the thickness direction of the piezoelectric substance single-crystal thin film 11. Thus, the piezoelectric substance single-crystal thin film 11 has film stress. If a high-temperature heat treatment is required to increase bonding strength, the piezoelectric substance single-crystal thin film 11 (the piezoelectric single-crystal substrate 1) tends to separate from the supporting substrate 12 due to film stress and thermal stress, and it is difficult to achieve stable and strong bonding. Thus, the method according to the present preferred embodiment in which the binder layer is supplied with sufficient moisture to promote conversion to silica at a low temperature and thus increases bonding strength is very effective in stably realizing strong bonding without the influence of thermal stress in bonding, particularly in the case of an elastic wave resonator device, which requires precise frequency control.

Furthermore, the binder layer 32 becomes the silicon oxide layer 33 as a result of the conversion to silica and therefore has very high hardness and a very low electric conductivity. Thus, the SAW device has excellent characteristics.

Although the binder layer 32 on the supporting substrate 12 side is bonded to the moisture-absorbing layer 31 on the piezoelectric substance single-crystal thin film 11 side in the present preferred embodiment, the binder layer 32 on the piezoelectric substance single-crystal thin film 11 side may be bonded to the moisture-absorbing layer 31 on the supporting substrate 12 side. Alternatively, the moisture-absorbing layer and the binder layer 32 may be stacked on the supporting substrate 12 or the piezoelectric substance single-crystal thin film 11, and the binder layer 32 may be bonded to the supporting substrate 12 or the piezoelectric substance single-crystal thin film 11.

Second Preferred Embodiment

A method for manufacturing a SAW device will be described below as a specific example of a method for manufacturing a piezoelectric device according to a second preferred embodiment of the present invention.

In the present preferred embodiment, in order to recover the piezoelectricity and crystallinity of a piezoelectric substance single-crystal thin film that are partly reduced by ion implantation, the piezoelectric substance single-crystal thin film is subjected to high-temperature heat treatment at approximately 500° C., for example. The manufacturing method described below thus avoids thermal deformation in the high-temperature heat treatment due to the difference in coefficients of linear expansion between a supporting substrate and the piezoelectric substance single-crystal thin film.

Figure 5:
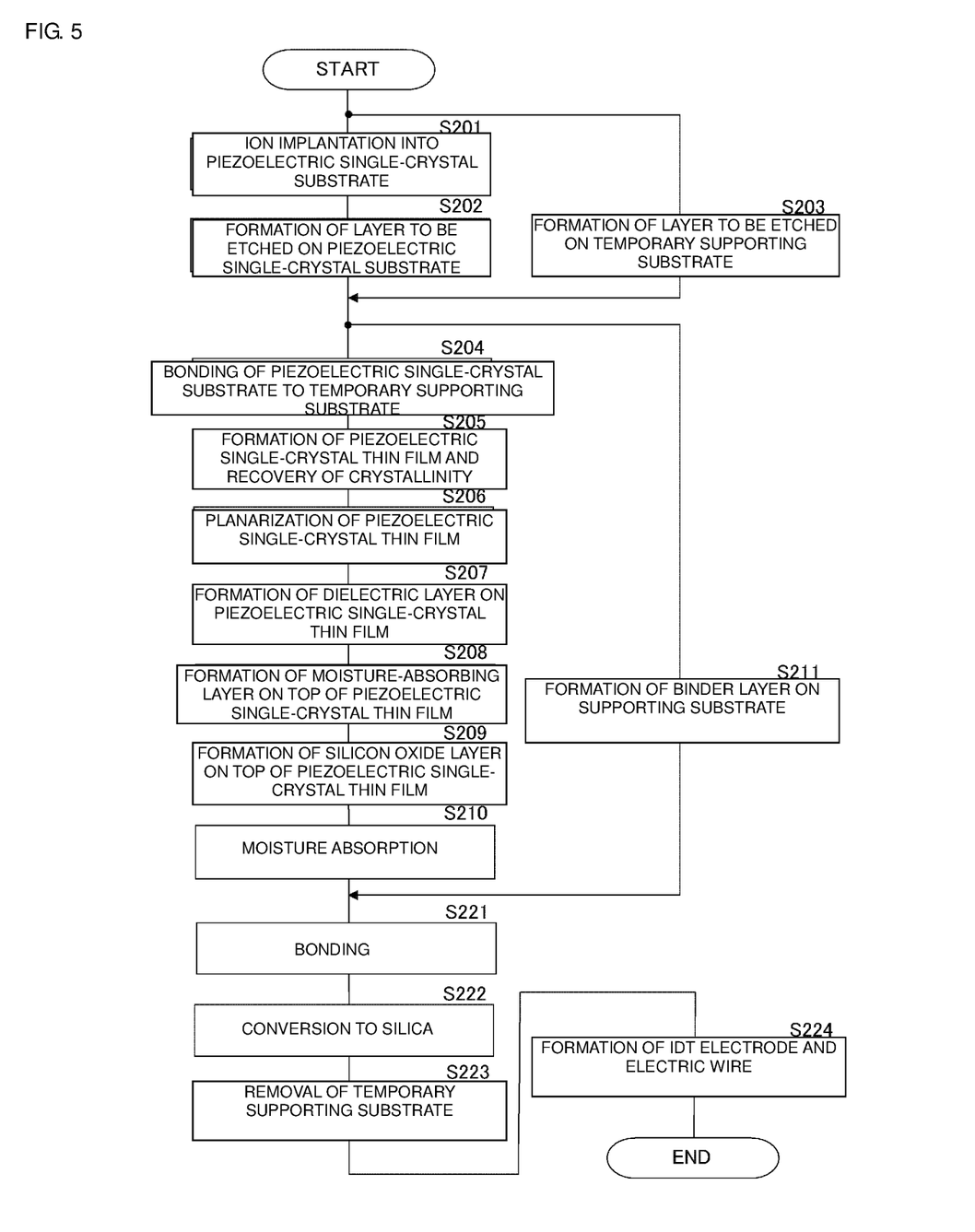
FIG. 5 is an explanatory view of the manufacturing flow of a method for manufacturing an elastic wave device according to a second preferred embodiment of the present invention.

FIG. 5 is an explanatory view of the manufacturing flow of a SAW device according to the present preferred embodiment.

Figure 6:
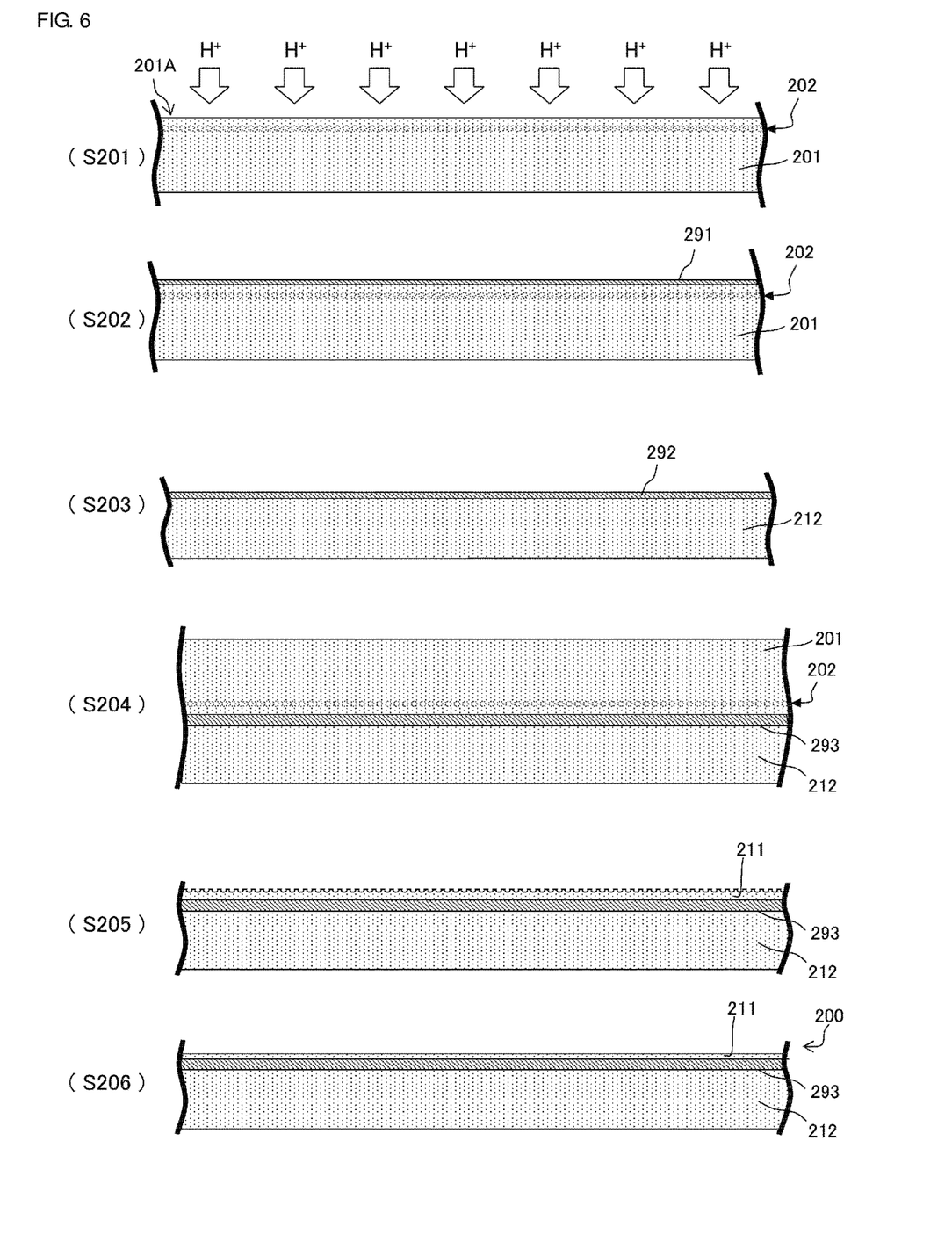
FIG. 6 is a schematic view of each step of the manufacturing flow illustrated in FIG. 5.
Figure 7:
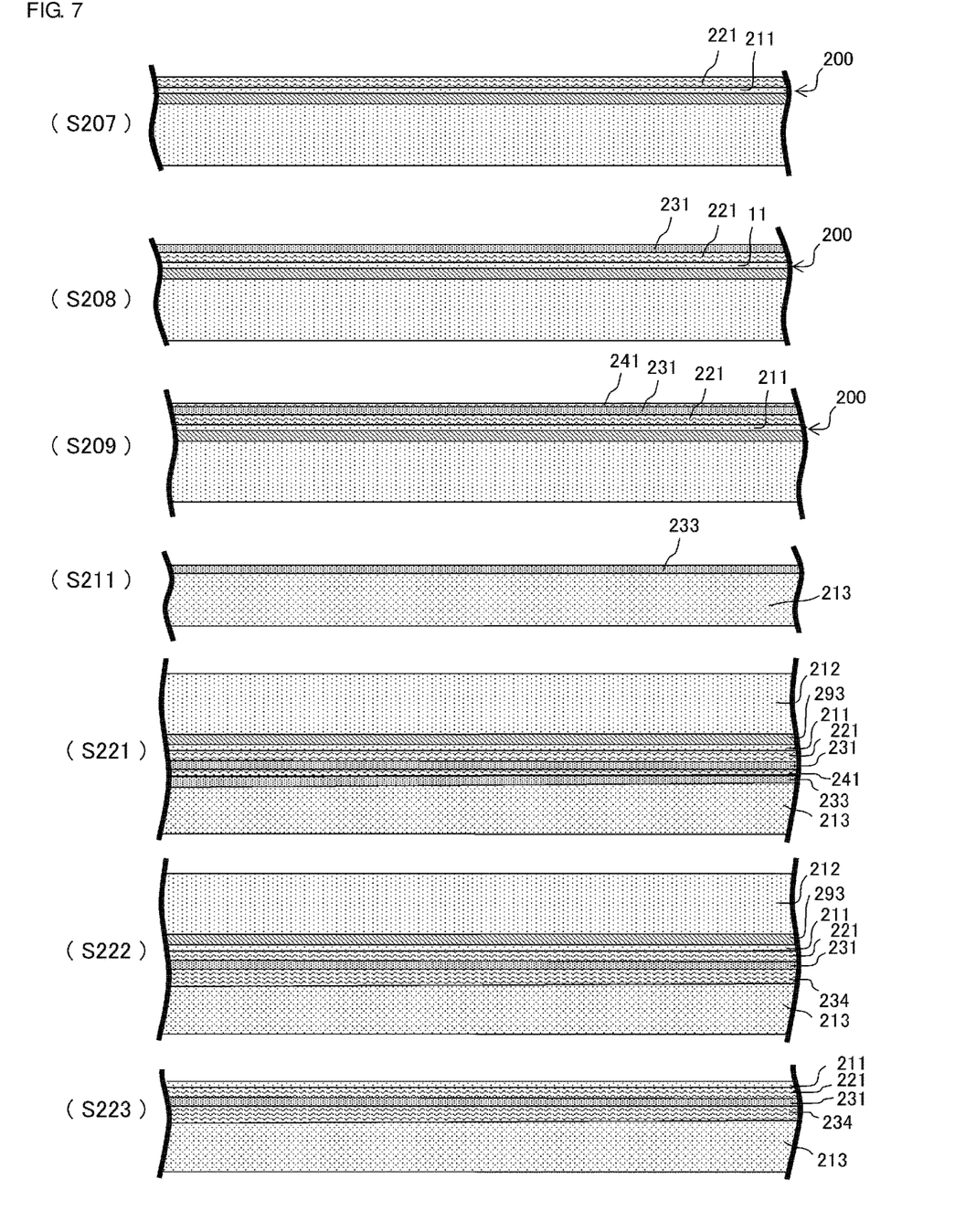
FIG. 7 is a schematic view of each step of the manufacturing flow illustrated in FIG. 5.

FIGS. 6 and 7 are schematic views of the steps of the manufacturing flow.

First, the piezoelectric single-crystal substrate 201 is prepared. Ions are implanted into a main surface 201A (bonding surface 201A) of a piezoelectric single-crystal substrate 201 (S201). As illustrated in FIG. 6 (S201), this forms a defective layer 202 at a predetermined depth from the bonding surface 201A of the piezoelectric single-crystal substrate 201.

As illustrated in FIG. 6 (S202), a layer to be etched 291 is then formed on the bonding surface 201A of the piezoelectric single-crystal substrate 201 (S202). The surface of the layer to be etched 291 is preferably flattened, for example, by CMP. The layer to be etched 291 will be removed by etching later. The layer to be etched 291 is a Cu film having a thickness of about 3 μm, for example.

As illustrated in FIG. 6 (S203), a temporary supporting substrate 212 is prepared. A layer to be etched 292 is also formed on the temporary supporting substrate 212 (S203). The surface of the layer to be etched 292 is preferably flattened, for example, by CMP. The temporary supporting substrate 212 is made of the same material as the piezoelectric single-crystal substrate 201. A downstream high-temperature heat treatment step is performed on a piezoelectric substance single-crystal thin film 211 (the reference numeral is not shown) while the piezoelectric substance single-crystal thin film 211 is bonded to the temporary supporting substrate 212 made of the same material. This prevents the piezoelectric single-crystal substrate 201 from cracking. The temporary supporting substrate 212 may be made of another material that has a small difference in coefficient of linear expansion from the piezoelectric substance single-crystal thin film 211 (the reference numeral is not shown). The layer to be etched 292 is a Cu film preferably having a thickness of about 3 μm, for example.

As illustrated in FIG. 6 (S204), the layer to be etched 292 (the reference numeral is not shown) is then bonded to the layer to be etched 291 (the reference numeral is not shown) to form a bonded layer to be etched 293 (S204). This bonding may be performed with a bonding method that can achieve a certain bonding strength. Since the temporary supporting substrate 212 and the piezoelectric single-crystal substrate 201 have the same coefficient of linear expansion, a heat-bonding method may also be used.

The temporary supporting substrate 212 bonded to the piezoelectric single-crystal substrate 201 through the bonded layer to be etched 293 is then placed in a heating environment of approximately 250° C., for example, (S205). As illustrated in FIG. 6 (S205), the piezoelectric single-crystal substrate 201 (the reference numeral is not shown) is separated from the defective layer 202 (the reference numeral is not shown), thus leaving the piezoelectric substance single-crystal thin film 211. The temporary supporting substrate 212 bonded to the piezoelectric substance single-crystal thin film 211 through the bonded layer to be etched 293 is then placed in a high-temperature environment of approximately 500° C., for example. This recovers the crystallinity of the piezoelectric substance single-crystal thin film 211 that was reduced by ion implantation. Since the temporary supporting substrate 212 and the piezoelectric single-crystal substrate 201 are made of the same material and have the same coefficient of linear expansion, such heat treatment causes little deformation, and the piezoelectric single-crystal substrate 201 is not broken.

As illustrated in FIG. 6 (S206), the surface of the piezoelectric substance single-crystal thin film 211 is then flattened, for example, by CMP (S206).

Through these steps, the piezoelectric substance single-crystal thin film 211 and the temporary supporting substrate 212 bonded together through the bonded layer to be etched 293 constitute a thin-film temporary supporting structure 200.

As illustrated in FIG. 7 (S207), a dielectric layer 221 is then formed on the piezoelectric substance single-crystal thin film 211 of the thin-film temporary supporting structure 200 (S207).

As illustrated in FIG. 7 (S208), a moisture-absorbing layer 231 is then formed on the dielectric layer 221 of the thin-film temporary supporting structure 200 (S208).

As illustrated in FIG. 7 (S209), a silicon oxide layer 241 is formed on the moisture-absorbing layer 231 of the thin-film temporary supporting structure 200, and the surface of the silicon oxide layer 241 is flattened, for example, by CMP (S209).

The thin-film temporary supporting structure 200 on which the moisture-absorbing layer 231 is formed is then left to stand in a high-humidity bath filled with water vapor for at least a predetermined period of time (S210).

As illustrated in FIG. 7 (S211), a supporting substrate 213 is prepared, and a binder layer 233 is formed on the supporting substrate 213 (S211).

As illustrated in FIG. 7 (S221), the binder layer 233 on the supporting substrate 213 side is then bonded to the silicon oxide layer 241 on the thin-film temporary supporting structure 200 side (S221).

The thin-film temporary supporting structure 200 bonded to the supporting substrate 213 is then left to stand in a heating environment of about 80° C. for a predetermined period of time (S222). Such a heating environment promotes the conversion of the binder layer 233 into silica, and the silica precursor is converted into silica (silicon oxide) at the low temperature. As illustrated in FIG. 7 (S222), a silicon oxide layer 234 is formed from the binder layer 233 (not shown), and thus the supporting substrate 213 is firmly bonded to the thin-film temporary supporting structure 200.

The composite including the piezoelectric substance single-crystal thin film 211, the temporary supporting substrate 212, and the supporting substrate 213 is immersed in an etchant, such as nitric acid, to etch the bonded layer to be etched 293, thus removing the bonded layer to be etched 293 and the temporary supporting substrate 212 (S223). As illustrated in FIG. 7 (S223), this forms a structure including the piezoelectric substance single-crystal thin film 211 bonded to the supporting substrate 213 through the silicon oxide layer 234.

An IDT electrode and a protective insulating film preferably are then formed in the same manner as in the first preferred embodiment (see FIG. 4), and SAW devices are manufactured by dicing (S224).

In this second preferred embodiment, the piezoelectric thin film is separated while the temporary supporting substrate is formed on the ion implanted surface of the piezoelectric substrate. The temporary supporting substrate is made of a material that produces no thermal stress at the interface between the temporary supporting substrate and the piezoelectric substrate or a material that produces smaller thermal stress at the interface between the temporary supporting substrate and the piezoelectric substrate than at the interface between the supporting substrate and the piezoelectric substrate. Thus, the risk of failure in the piezoelectric thin film due to thermal stress during the separation of the piezoelectric thin film can be lower than before. After heating for the separation of the piezoelectric thin film, the supporting substrate is formed on the piezoelectric thin film. Thus, the constituent material of the supporting substrate may have any coefficient of linear expansion without considering thermal stress acting on the interface between the supporting substrate and the piezoelectric thin film.

This increases the degree of freedom in selecting the combinations of the constituent material of the piezoelectric thin film and the constituent material of the supporting substrate. For example, in the case of devices for filter applications, use of a supporting substrate made of a constituent material having a much smaller coefficient of linear expansion than a piezoelectric thin film improves the temperature-frequency characteristics of the filter. Use of a constituent material having high thermal conductivity for the supporting substrate improve the heat radiation characteristics and the electric power handling capability of the supporting substrate. Use of an inexpensive constituent material for the supporting substrate reduces the manufacturing costs of the device.

Third Preferred Embodiment

With respect to a piezoelectric device according to a third preferred embodiment of the present invention, a method for manufacturing a bulk acoustic wave (BAW) device will be described below. In the bulk acoustic wave (BAW) device, a piezoelectric substance single-crystal thin film is supported by a membrane structure.

Figure 8:
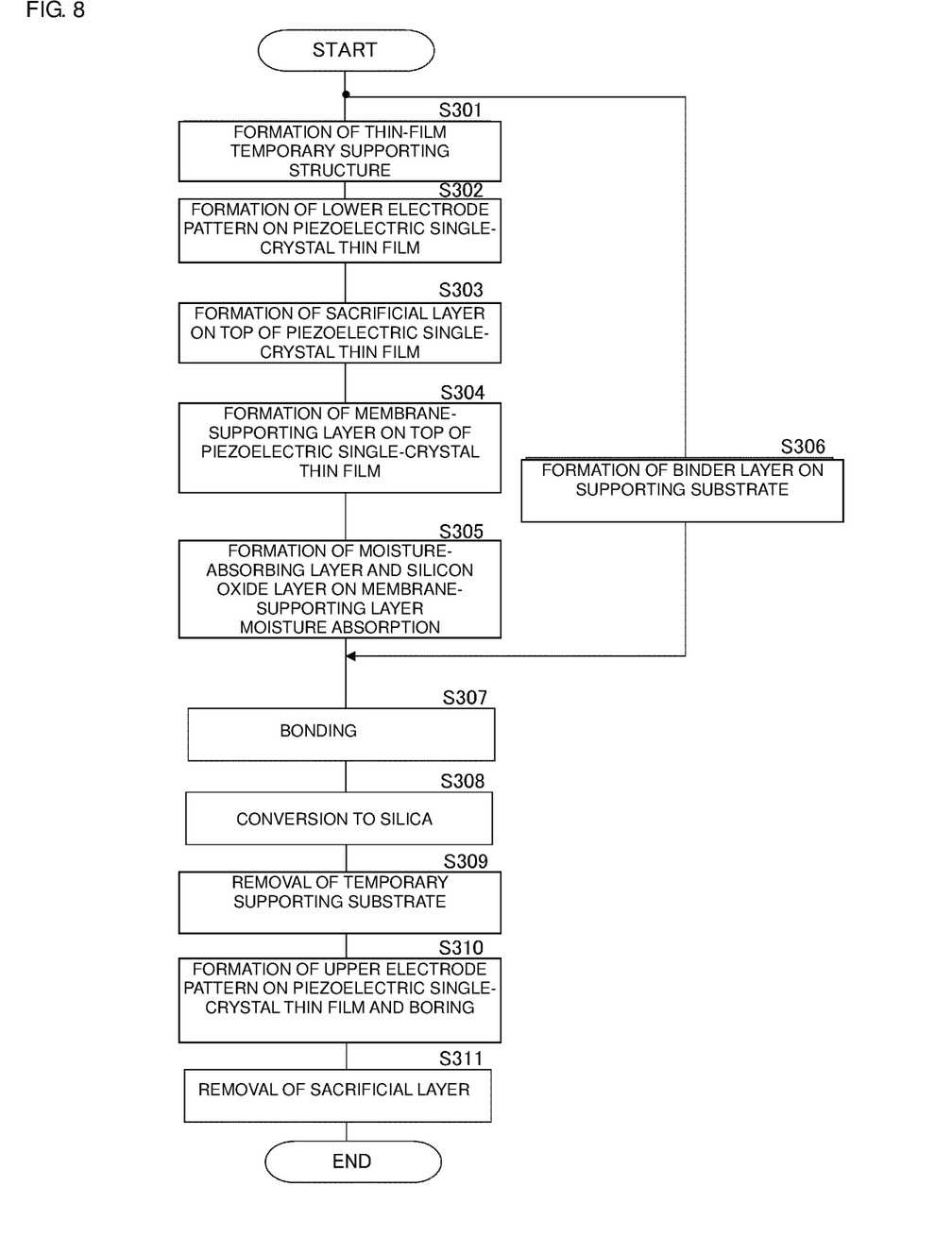
FIG. 8 is an explanatory view of the manufacturing flow of a method for manufacturing an elastic wave device according to a third preferred embodiment of the present invention.

FIG. 8 is an explanatory view of the manufacturing flow of a BAW device according to the present preferred embodiment.

Figure 9:
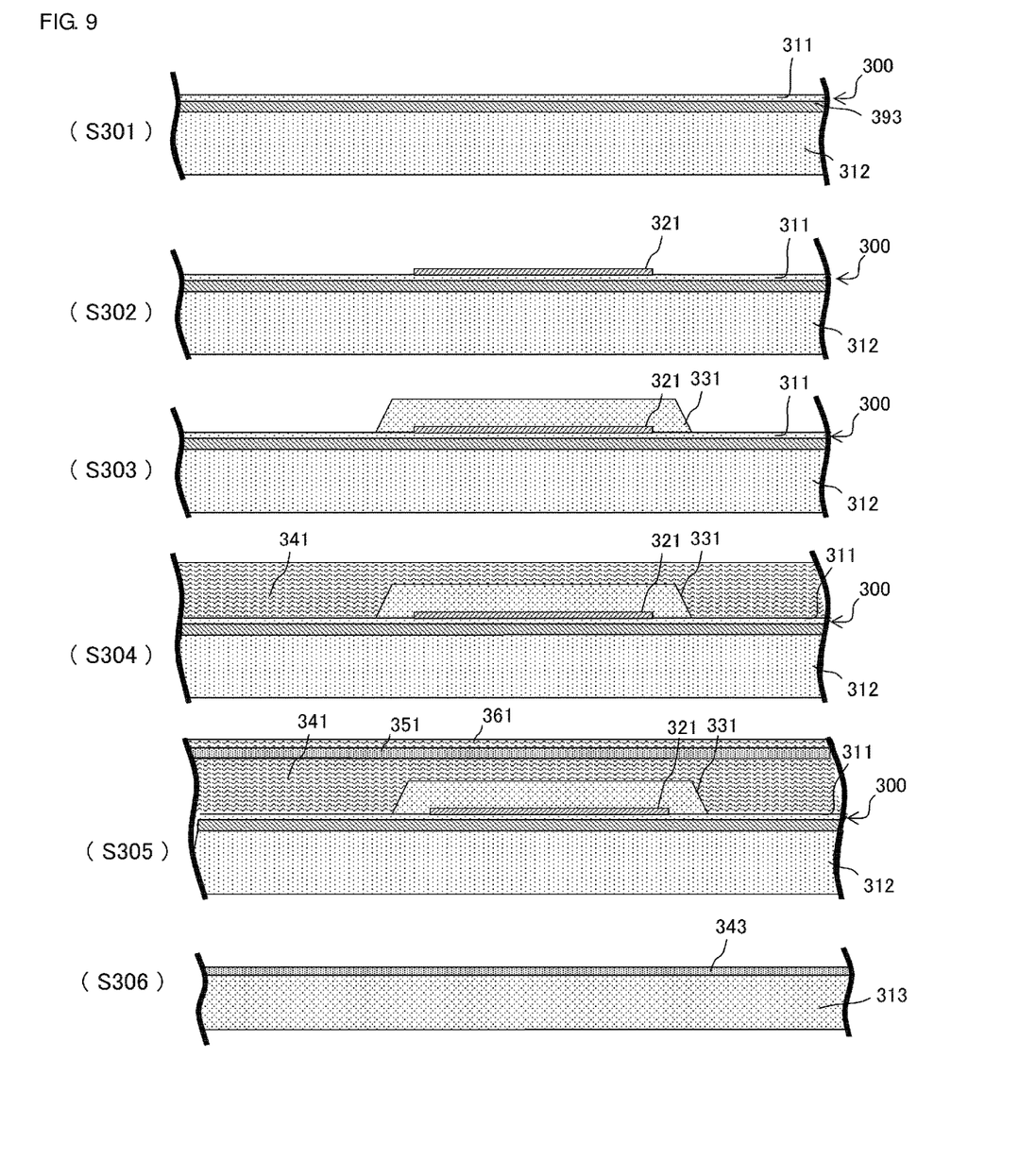
FIG. 9 is a schematic view of each step of the manufacturing flow illustrated in FIG. 8.
Figure 10:
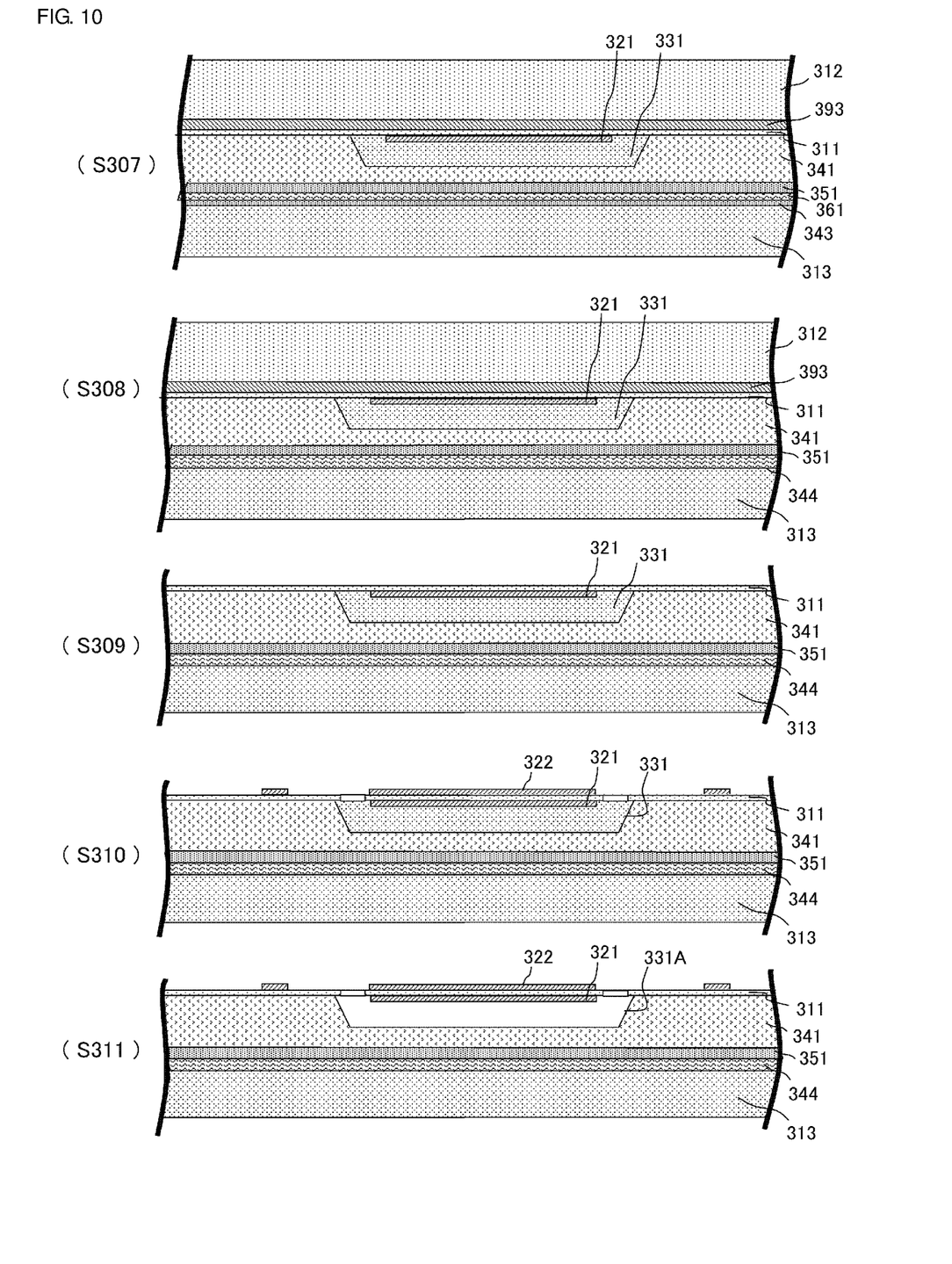
FIG. 10 is a schematic view of each step of the manufacturing flow illustrated in FIG. 8.

FIGS. 9 and 10 are schematic views of the steps of the manufacturing flow.

In the present preferred embodiment, as illustrated in FIG. 9 (S301), a thin-film temporary supporting structure 300 is first formed in the same manner as in the second preferred embodiment. The thin-film temporary supporting structure 300 includes a piezoelectric substance single-crystal thin film 311 bonded to a temporary supporting substrate 312 through a bonded layer to be etched 393 (S301).

As illustrated in FIG. 9 (S302), a lower electrode pattern 321 that drives the BAW device is then formed on the piezoelectric substance single-crystal thin film 311 of the thin-film temporary supporting structure 300 (S302).

As illustrated in FIG. 9 (S303), a sacrificial layer pattern 331 used to form a cavity of the membrane structure is then formed on the piezoelectric substance single-crystal thin film 311 of the thin-film temporary supporting structure 300 so as to cover the lower electrode pattern 321 (S303).

As illustrated in FIG. 9 (S304), a membrane-supporting layer 341 is then formed on the piezoelectric substance single-crystal thin film 311 of the thin-film temporary supporting structure 300 so as to cover the sacrificial layer pattern 331 (S304). After sputter deposition, the surface of the membrane-supporting layer 341 is flattened by CMP. The membrane-supporting layer 341 is a silicon oxide layer.

As illustrated in FIG. 9 (S305), a moisture-absorbing layer 351 and a silicon oxide layer 361 for planarization are formed on the membrane-supporting layer 341 of the thin-film temporary supporting structure 300 (S305). The surface of the silicon oxide layer 361 is flattened, for example, by CMP. The thin-film temporary supporting structure 300 is then left to stand in a high-humidity bath filled with water vapor for at least a predetermined period of time.

As illustrated in FIG. 9 (S306), a supporting substrate 313 is then prepared, and a binder layer 343 is formed on the supporting substrate 313 (S306).

As illustrated in FIG. 10 (S307), the binder layer 343 on the supporting substrate 313 side is then bonded to the silicon oxide layer 361 on the thin-film temporary supporting structure 300 side (S307).

The thin-film temporary supporting structure 300 bonded to the supporting substrate 313 is then left to stand in a heating environment of about 80° C. for a predetermined period of time (S308). Such a heating environment promotes the conversion of the binder layer 343 into silica, and the silica precursor is converted into silica (silicon oxide) at the low temperature. As illustrated in FIG. 10 (S308), a silicon oxide layer 344 is formed from the binder layer 343 (not shown), and thus the supporting substrate 313 is firmly bonded to the thin-film temporary supporting structure 300.

The composite including the piezoelectric substance single-crystal thin film 311, the temporary supporting substrate 312, and the supporting substrate 313 is immersed in an etchant, such as nitric acid, to etch the bonded layer to be etched 393, thereby removing the bonded layer to be etched 393 and the temporary supporting substrate 312 (S309). As illustrated in FIG. 10 (S309), this forms a structure including the piezoelectric substance single-crystal thin film 311 bonded to the supporting substrate 313 through the silicon oxide layer 344.

As illustrated in FIG. 10 (S310), holes are then bored in the piezoelectric substance single-crystal thin film 311, and an upper electrode pattern 322 for driving the BAW device is formed (S310).

As illustrated in FIG. 10 (S311), an etchant is then introduced into the sacrificial layer pattern 331 (the reference numeral is not shown) through the holes of the piezoelectric substance single-crystal thin film 311 to remove the sacrificial layer pattern 331 (the reference numeral is not shown), thus forming a membrane space 331A (S311).

BAW devices are then manufactured by dicing.

Although a piezoelectric device according to the present invention can be manufactured by the manufacturing methods described in these preferred embodiments, the piezoelectric device may be manufactured by another method. For example, a piezoelectric single-crystal thin film may be formed by ion implantation into the piezoelectric single-crystal substrate followed by separation, by grinding the piezoelectric single-crystal substrate, or by etching the piezoelectric single-crystal substrate.

Although the SAW device and the BAW device are described as piezoelectric devices in the present preferred embodiment, the present invention is not limited to these devices and may be applied to boundary acoustic wave devices that include an insulating layer covering an IDT electrode, plate wave devices, and Lamb wave devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device, comprising:

a moisture-absorbing layer forming step of forming a moisture-absorbing layer on a bonding surface side of one of a piezoelectric substrate and a supporting substrate;

a moisture-absorbing step of allowing the moisture-absorbing layer to absorb moisture;

a binder layer forming step of forming a binder layer stacked on one of the bonding surface sides of the piezoelectric substrate and the supporting substrate, the binder layer being formed of a material containing a silica precursor that is capable of undergoing a hydrolysis reaction at a temperature of about 100° C. or less;

a bonding step of bonding the piezoelectric substrate to the supporting substrate with the binder layer and the moisture-absorbing layer interposed between the bonding surface sides of the piezoelectric substrate and the supporting substrate; and a binder layer solidifying step of hydrolyzing the silica precursor with moisture absorbed in the moisture-absorbing layer to convert the silica precursor into silica.

2. The method for manufacturing a piezoelectric device according to claim 1, wherein the piezoelectric substrate is formed of a piezoelectric single crystal.

3. The method for manufacturing a piezoelectric device according to claim 2, wherein the piezoelectric substrate is an LT substrate, an LN substrate, or a quartz substrate.

4. The method for manufacturing a piezoelectric device according to claim 1, wherein the moisture-absorbing layer is a porous film, an aluminum nitride film, or a silicon oxide layer, the silicon oxide layer being formed by sputtering or low-temperature CVD.

5. The method for manufacturing a piezoelectric device according to claim 1, wherein the bonding step and the binder layer solidifying step are performed in a reduced pressure atmosphere.

6. The method for manufacturing a piezoelectric device according to claim 1, further comprising:

an ion implantation step of implanting an ionized element into the piezoelectric substrate to form a region having a high concentration of the ionized element in the piezoelectric substrate; and a separation step of separating a region on the bonding surface side of the piezoelectric substrate as a piezoelectric thin film by heating.

7. The method for manufacturing a piezoelectric device according to claim 1, further comprising:

an ion implantation step of implanting an ionized element into the piezoelectric substrate to form a region having a high concentration of the element in the piezoelectric substrate;

a temporary supporting step of forming a temporary supporting substrate on a side of the piezoelectric substrate that has been implanted with the ionized element, the temporary supporting substrate being made of a same material as the piezoelectric substrate or producing a thermal stress at an interface between the temporary supporting substrate and the piezoelectric substrate smaller than the thermal stress at an interface between the supporting substrate and the piezoelectric substrate;

a separation step of separating a region of the piezoelectric substrate from the bonding surface side of the piezoelectric substrate bonded to the temporary supporting substrate by heating thereby forming a piezoelectric thin film on the temporary supporting substrate; and a supporting step of forming the supporting substrate on the piezoelectric thin film after the separation step.

8. The method for manufacturing a piezoelectric device according to claim 1, further comprising a functional electrode forming step of forming a functional electrode on the piezoelectric thin film.

* * * * *